United States Patent
Angelini et al.

(10) Patent No.: US 7,474,474 B2
(45) Date of Patent: Jan. 6, 2009

(54) HIGH-HEAT DISSIPATION LIGHTING LENS

(75) Inventors: Marco Angelini, Bereguardo (IT); Claudia Bigliati, Trino (IT); Natale Baraldo, Paderno Dugnano (IT); Luca Scodes, San' Angelo Lodigiano (IT)

(73) Assignee: Fraen Corporation S.R.L., Milan (IT)

( * ) Notice: Subject to any disclaimer, the term of this patent is extended or adjusted under 35 U.S.C. 154(b) by 0 days.

(21) Appl. No.: 12/028,525

(22) Filed: Feb. 8, 2008

(65) Prior Publication Data
US 2008/0130137 A1 Jun. 5, 2008

Related U.S. Application Data

(63) Continuation of application No. 10/497,819, filed as application No. PCT/IT02/00767 on Dec. 6, 2002, now Pat. No. 7,349,163.

(30) Foreign Application Priority Data

Dec. 6, 2001 (IT) .......................... MI2001A2579

(51) Int. Cl.
*G02B 3/02* (2006.01)
*F21V 7/00* (2006.01)
*F21V 29/00* (2006.01)
*F21V 3/00* (2006.01)

(52) U.S. Cl. ....................... 359/708; 359/712; 359/719; 362/310; 362/311; 362/294; 362/308; 362/347; 362/551; 257/98; 257/99; 348/189

(58) Field of Classification Search ......... 359/708–712, 359/718, 719, 726, 731, 737, 741, 364, 856–858, 359/811, 819, 820, 641, 642, 664; 362/303, 362/308, 310, 311, 327, 328, 516, 522, 555, 362/517, 299, 520, 306, 628, 223, 267, 237, 362/347, 29, 294; 257/98, 99, 676; 250/216; 252/70, 71; 348/189, 383, 602; 313/512
See application file for complete search history.

(56) References Cited

U.S. PATENT DOCUMENTS 4,336,580 A * 6/1982 Mouyard et al. ............ 362/347

(Continued)

FOREIGN PATENT DOCUMENTS

DE 19728354 1/1999

(Continued)

OTHER PUBLICATIONS

English Translation of Title and Abstract of WO 01/45180 dated Jun. 21, 2001.

*Primary Examiner*—Loha Ben
(74) *Attorney, Agent, or Firm*—Nutter McClennen & Fish LLP; Reza Mollaaghababa; Joshua T. Matt

(57) ABSTRACT

There is provided a lighting module of the type having a solid-state light source, in particular a LED, a supporting plate, and a lens; the lens has a recess housing the light source; the lens is supported by and projects from the plate by means of supporting members carried by the lens and for fitting the lens directly to the plate; and the supporting members are formed in one piece with the lens, and are spaced apart and separated from one another by cooling windows.

20 Claims, 3 Drawing Sheets

U.S. PATENT DOCUMENTS

| | | | |
|---|---|---|---|
| 4,767,172 A * | 8/1988 | Nichols et al. | 385/146 |
| 5,173,810 A * | 12/1992 | Yamakawa | 359/819 |
| 5,485,317 A * | 1/1996 | Perissinotto et al. | 359/712 |
| 5,526,190 A * | 6/1996 | Hubble et al. | 359/719 |
| 5,757,557 A * | 5/1998 | Medvedev et al. | 359/708 |
| 5,894,195 A * | 4/1999 | McDermott | 313/512 |
| 6,328,456 B1 * | 12/2001 | Mize | 362/311 |
| 6,361,190 B1 * | 3/2002 | McDermott | 362/310 |
| 6,558,032 B2 | 5/2003 | Kondo et al. | |
| 6,598,998 B2 | 7/2003 | West et al. | |
| 6,961,190 B1 | 11/2005 | Tamaoki et al. | |
| 7,283,313 B2 | 10/2007 | Tamaoki et al. | |
| 7,349,163 B2 | 3/2008 | Angelini et al. | |

FOREIGN PATENT DOCUMENTS

| | | |
|---|---|---|
| EP | 1174930 | 1/2002 |
| WO | WO-9909349 | 2/1999 |
| WO | WO-0036336 | 6/2000 |
| WO | WO-0145180 | 6/2001 |

* cited by examiner

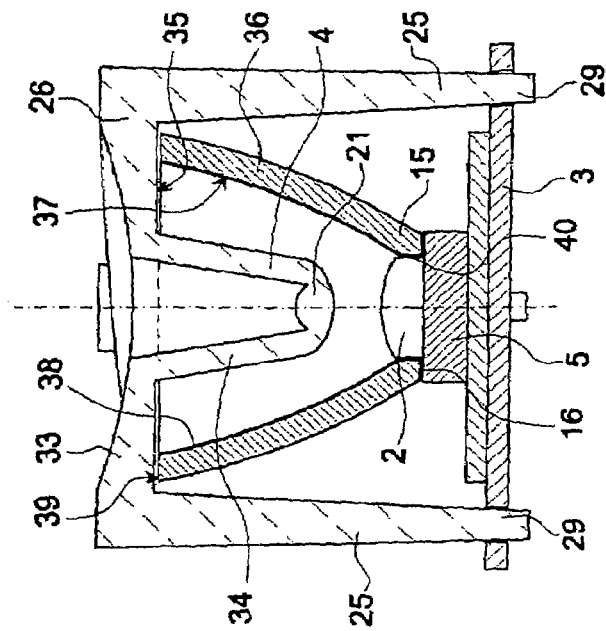
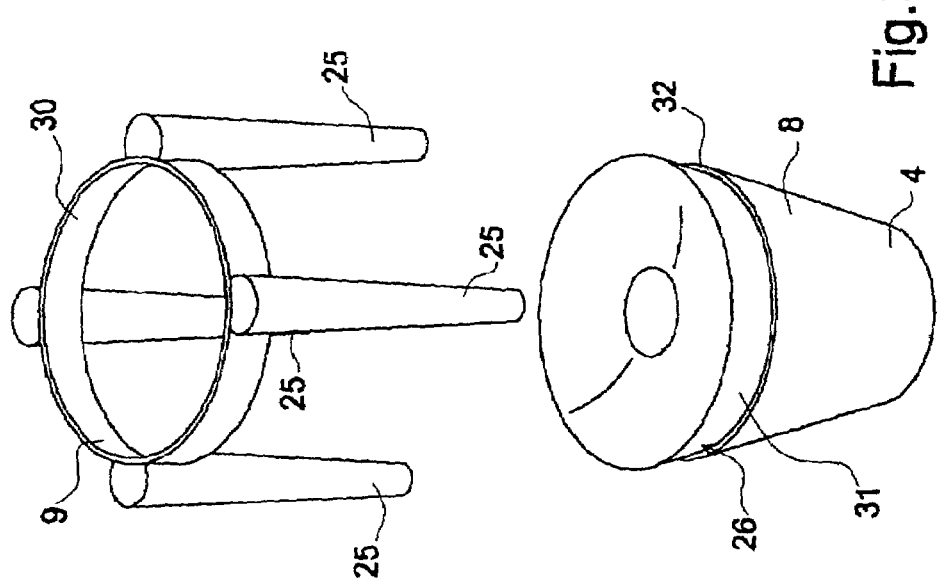

HIGH-HEAT DISSIPATION LIGHTING LENS

This application is a continuation of U.S. application Ser. No. 10/497,819, filed Jan. 5, 2005, now U.S. Pat. No. 7,349, 163, which is the National Stage (35 U.S.C. § 371) of International Application No. PCT/IT02/00767, filed Dec. 6, 2002 and titled "HIGH-HEAT DISSIPATION LIGHTING MODULE", which claims priority to Italian Application MI2001A002579, filed Dec. 9, 2001.

TECHNICAL FIELD

The present invention relates to a high-heat-dissipation lighting module of the type comprising a solid-state light source, in particular a LED, connected to a lens.

BACKGROUND ART

A lighting module of this type is known, for example, from Japanese Patent Application JP 61-147585, which describes a module comprising a LED supported on a mount, and a total-internal-reflection lens having a recess in which the LED is housed; and both the lens and the LED are housed in a cylindrical casing. By housing the LED/lens assembly inside a casing, this and other similar modules (a further example is described in U.S. Pat. No. 6,274,924) are difficult to produce, mainly on account of the necessity to assemble and connect the various component parts (the lens, in particular, is normally glued), and also have the major drawback of failing, in use, to effectively disperse the heat generated by the LED.

The problem of effectively cooling the LED is further compounded when the LED is housed inside a-recess in the lens, in which case, dissipating plates fitted to the LED mount may not always be sufficient.

A further drawback lies in the lens normally being molded in a one-piece body from transparent polymer material And since the lens is relatively thick, with an axial dimension comparable (i.e. substantially equal to or greater than) the transverse dimension, a relatively long molding time is required.

Moreover, the efficiency of total-internal-reflection lenses (and, therefore, of lighting modules equipped with them) is greatly affected by the condition of the reflecting surface, and may be impaired in the event the surface is damaged or even only contaminated. The problem therefore arises of effectively protecting the reflecting surface, both in use and, above all, when manufacturing and handling the lens and assembling the lighting module.

DISCLOSURE OF INVENTION

It is an object of the present invention to provide a lighting module of the type incorporating a solid-state light source (LED) and a lens, designed to provide a solution to the aforementioned problems of the known state of the art. More specifically, it is an object of the invention to provide a module with a high heat dissipation capacity, and which at the same time is cheap and easy to produce.

According to the present invention, there is provided a high-heat-dissipation lighting module of the type comprising a solid-state light source, a supporting plate, and a lens; the module being characterized in that said lens is supported by and projects from the plate by means of a supporting structure having cooling windows.

In a preferred embodiment, the lens comprises an optical body and a shell, for covering the optical body, which are made of respective different materials; the shell being positioned to cover a lateral surface of the optical body, and being separated from said lateral surface by a gap.

According to a further aspect of the invention, there are provided a lighting module and a lens that can be used in such a module, characterized in that the lens has an input surface facing the light source in use, and an output surface; which output surface has a dead cavity.

BRIEF DESCRIPTION OF THE DRAWINGS

A number of non-limiting embodiments of the invention will be described by way of example with reference to the accompanying drawings, in which:

FIG. 3 shows a partial exploded view of a variation of the FIG. 1 module;

FIG. 4 shows a schematic section of a further variation of the FIG. 1 module;

BEST MODE FOR CARRYING OUT THE INVENTION

Figure 2:
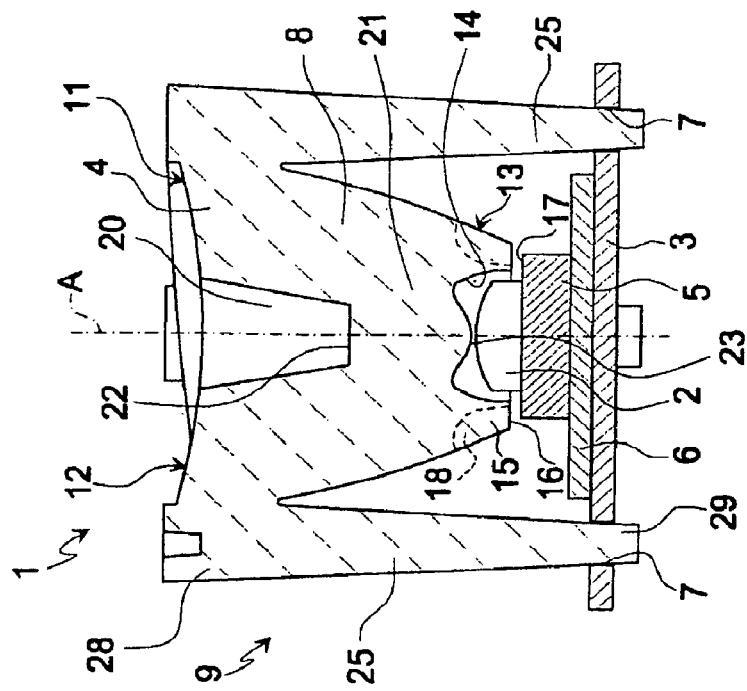
FIG. 2 shows a schematic longitudinal section of the FIG. 1 module assembled.
Figure 1:
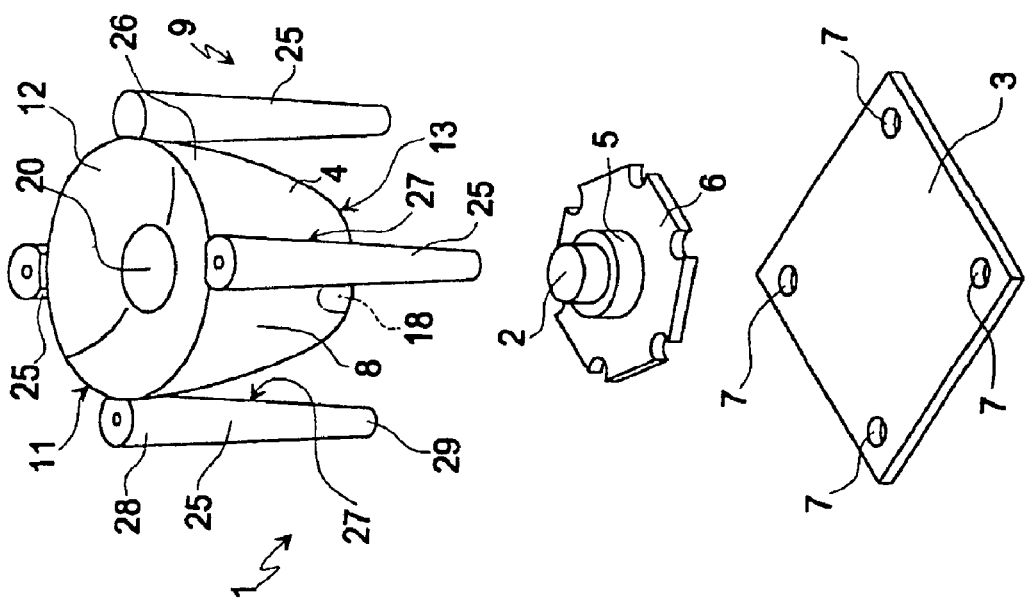
FIG. 1 shows a schematic, exploded view in perspective of a lighting module in accordance with the invention.

Number 1 in FIGS. 1 and 2 indicates a lighting module comprising a solid-state light source 2, in particular a LED, a supporting plate 3, and a lens 4.

LED 2 is supported on a known mount 5 (shown only schematically) comprising an optional known dissipating plate 6. For the sake of simplicity, known contacts and connections for connecting LED 2 electrically to an external network are not shown. Mount 5 (or dissipating plate 6, if any) is fixed to plate 3 by known heat-conducting adhesive.

Plate 3 is a substantially flat heat-dissipating plate of any shape made, for example, of metal material, and has four seats 7 defined by respective circular-section through holes.

Lens 4 is a total-internal-reflection lens, and comprises a substantially cup-shaped optical body 8 made of transparent plastic material (e.g. polycarbonate PC or polymethyl methacrylate PMMA); and a supporting structure 9 by which lens 4 is supported by and projects from plate 3.

In the example shown, optical body 8 is a rotationally symmetrical body of revolution, and has an axis of symmetry A. At a first axial end 11, optical body 8 comprises a flat or, as shown in the drawings, a saddle-shaped end surface 12; and, at a second axial end 13 opposite first axial end 11, optical body 8 comprises a recess 14 in which LED 2 is inserted.

Recess 14 is defined by a collar 15 radially and loosely surrounding LED 2 and terminating with an end edge 16, which fits onto mount 5 and rests axially on an annular shoulder 17 of mount 5.

In a preferred embodiment shown schematically by the dash line in FIG. 1, collar 15 has radial through ventilation openings 18 terminating inside recess 14.

Optical body 8 also comprises a dead cavity 20 extending along axis of symmetry A from end surface 12 towards axial end 13, i.e. towards recess 14, and separated from recess 14 by a partition 21 bounded by two opposite faces 22, 23 respectively defining a flat bottom surface of cavity 20, and a curved bottom surface, facing LED 2, of recess 14.

Face 23, together with an inner lateral surface of collar 15, defines recess 14, and constitutes an input surface into optical body 8 for the light emitted by LED 2; face 22 and end surface 12 define an output surface for the light beam travelling through optical body 8; and a lateral surface, between axial ends 11 and 13, of optical body 8 defines an internal reflection surface of lens 4.

Cavity 20 may be of various shapes, e.g. substantially cylindrical or truncated-cone-shaped, extends along axis of symmetry A (which defines an optical axis of lens 4), and is substantially aligned with recess 14. Faces 22, 23 may be shaped otherwise than as shown herein by way of example: face 22, in particular, defines an auxiliary optical surface, which may be shaped to impart specific characteristics to the light beam emitted by lens 4. When designing lens 4, in addition to designing the overall shape and the input and output surfaces of optical body 8, the shape of the auxiliary optical surface may therefore also be designed to increase the number of types of beams obtainable.

Cavity 20 also reduces the thickness of optical body 8 as compared with that of a solid piece, thus greatly reducing molding time.

Supporting structure 9 comprises a number of supporting members 25 formed in one piece with optical body 8. In the example shown, four rod-shaped supporting members 25 are provided, and project from a peripheral edge 26 of lens 4 in a direction substantially parallel to axis of symmetry A. Supporting members 25 may be molded in one piece with optical body 8, e.g. from the same material as optical body 8, or may be co-molded or molded on, possibly from other materials than that of optical body 8.

Supporting members 25 are spaced, e.g. equally spaced, circumferentially along peripheral edge 26, which also bounds end surface 12; and ample radial cooling windows 27 are defined between, and so separate, supporting members 25.

Supporting members 25 have respective longitudinal ends 28 for attachment to peripheral edge 26; and respective longitudinal ends 29 inserted and locked inside seats 7 in plate 3. More specifically, longitudinal ends 29 are inserted through seats 7 and riveted or clinched onto plate 3. In a variation not shown, longitudinal ends 29 click onto respective seats 7 in any known manner.

Lens 4 thus rests axially on mount 5 (by means of collar 15 cooperating with shoulder 17) and is secured to plate 3 by supporting members 25.

Supporting members 25 carried by, and in fact formed in one piece with, lens 4 therefore provide for fitting lens 4 directly to plate 3; and lens 4 is supported by and projects from plate 3 also by means of supporting members 25.

FIG. 3, in which details similar to or identical with those already described are indicated using the same reference numbers, shows a variation of module 1 according to the invention, and which is identical to the one already described, except that supporting structure 9 is formed as a separate component from optical body 8, and is fitted to lens 4. More specifically, supporting structure 9 comprises a ring 30 from which supporting members 25 extend; ring 30 is housed in a seat 31 formed along peripheral edge 26 of lens 4 and having an annular shoulder 32; and, when module 1 is assembled, longitudinal ends 29 of supporting members 25 are fitted to plate 3, and ring 30 rests axially on shoulder 32 to grip lens 4 onto mount 5 and therefore onto plate 3. Supporting members 25 and ring 30 may be made of the same or different material from optical body 8.

In the FIG. 4 variation, in which details similar to or identical with those already described are indicated using the same reference numbers, lens 4 comprises a disk 33, from the peripheral edge 26 of which supporting members 25 extend; and a preferably hollow central portion 34 extending axially along axis of symmetry A from a face 35 of disk 33, and terminating with a partition 21 facing LED 2. Lens 4 is associated with a reflector 36 defined by a cup-shaped hollow body coaxially surrounding central portion 34 and having an inner surface 37 with a reflecting layer 38, e.g. chromium-plated, aluminized, etc.

Disk 33 and central portion 34 are formed in one piece with supporting members 25, e.g. from transparent polymer material, such as PC or PMMA, while reflector 36 is formed as a separate component, e.g. from opaque polymer material, such as ABS or similar.

At axially opposite ends, reflector 36 has an annular edge 39 resting on face 35 of disk 33, and a through hole 40 housing LED 2 and defined by a collar 15, which terminates with an end edge 16 for connection to mount 5 and may have radially through ventilation openings (not shown).

Once longitudinal ends 29 of supporting members 25 are fitted to plate 3, reflector 36 is gripped between disk 33 and mount 5.

Figure 6:
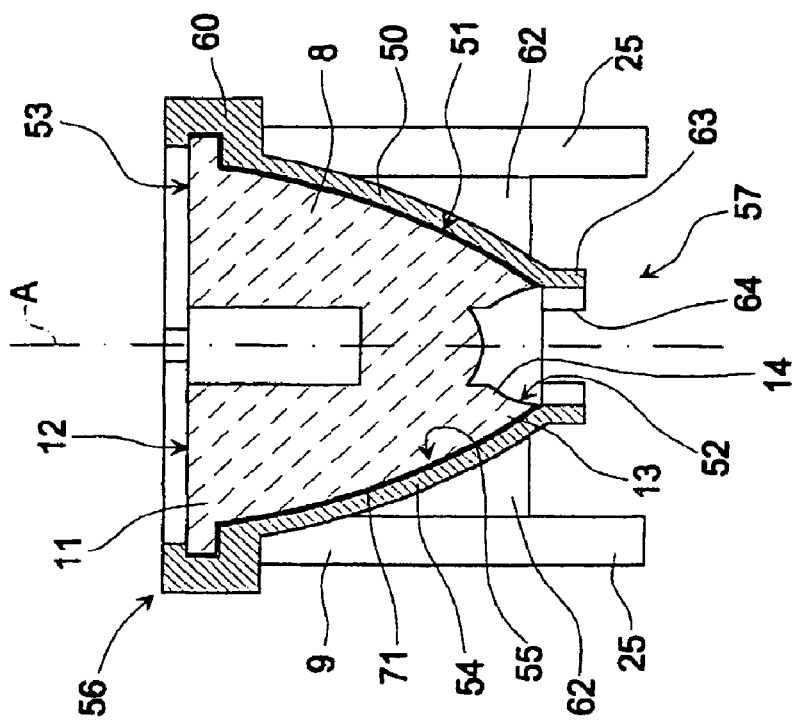
FIGS. 5 and 6 show, respectively, a schematic exploded view in perspective and a partial longitudinal section of a further embodiment of the invention.
Figure 5:
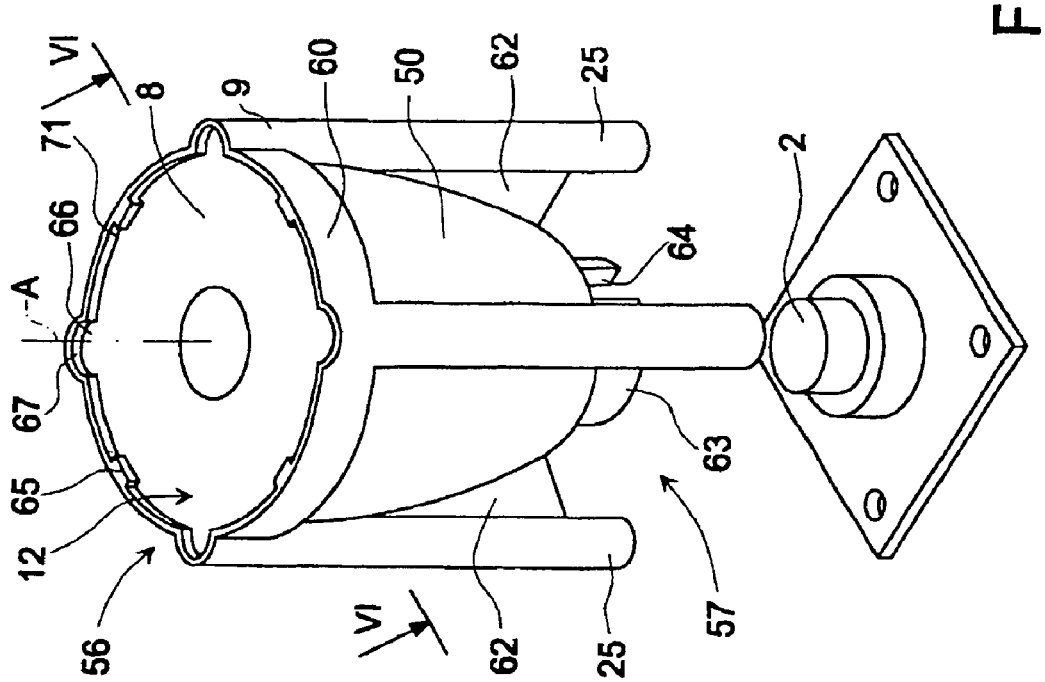

In the FIGS. 5 and 6 variation, in which details similar to or identical with those already described are indicated using the same reference numbers, supporting structure 9 comprises a cover shell 50 extending along axis A and coaxial with and radially outwards of optical body 8 to safeguard optical body 8 against contaminants and possible damage.

Optical body 8 is made of a first substantially transparent, low-absorbance polymer material, while shell 50 (and, advantageously, the whole of supporting structure 9) is made of a second opaque polymer material of good mechanical strength.

Shell 50 is shaped to cover an outer lateral surface 51 of and defining a reflecting surface of optical body 8; lateral surface 51 extends between axial ends 11 and 13 of optical body 8, and in particular between an input surface 52, defined by a surface bounding recess 14 and through which the light emitted by LED 2 enters optical body 8, and an output surface 53 defined by end surface 12 and from which the light travelling through optical body 8 is emitted; and lateral surface 51 is shaped so that optical body 8 operates in total-internal-reflection mode.

Shell 50 has a curved wall 54 surrounding lateral surface 51 and defining internally a cavity 55 housing optical body 8.

Shell 50 has two open, axially opposite ends 56, 57 end 56 has a ring 60, from which supporting members 25 project axially (and are connected to curved wall 54 of shell 50 by respective ribs 62); and end 57 has a collar 63 aligned with and contiguous to recess 14 of optical body 8, and having radial openings 64.

Axial and circumferential retaining members are provided for securing optical body 8 axially and circumferentially inside cavity 55. For example, end 56 of shell 50 has projecting, radially inner teeth 65, which cooperate axially with end surface 12 of optical body 8 to secure optical body 8 axially inside cavity 55; and axial end 11 of optical body 8 has at least one radially projecting tooth 66 which engages a seat 67 formed in ring 60 to secure optical body 8 circumferentially inside cavity 55.

Shell 50 faces lateral surface 51 of optical body 8, and is separated from lateral surface 51 by a gap 71 for ensuring substantially all the light entering optical body 8 through input surface 52 is reflected by lateral surface 51 inside optical body 8. Optical body 8 thus operates in total-internal-reflection mode, with a high degree of efficiency, and with none of the dispersion phenomena which would occur if lateral surface 51 of optical body 8 were to contact shell 50 directly.

For this purpose, a very small gap 71 (even of micrometric proportions) is sufficient.

Shell 50 and optical body 8 may be formed as separate components and then fitted together (e.g. by fitting or clicking optical body 8 inside shell 50); in which case, gap 71 is defined by a small clearance between optical body 8 and shell 50.

Alternatively, gap 71 is formed when producing lens 4: shell 50 and optical body 8 are made of respective appropriately selected polymer materials with no or very little chemical compatibility or affinity; and lens 4 is formed using a known two-material molding process (co-molding or over-molding). At a first step in the process, optical body 8 is molded from a first substantially transparent material; and at a second step in the process, shell 50 is molded from a second material having no or very little compatibility with the first material.

In the course of the two-material molding process, the mating surfaces between the two materials (i.e. between optical body 8 and shell 50) do not adhere to each other, owing to the poor compatibility of the materials; and, as the materials cool, gap 71 is formed by the difference in thermal shrinkage of the materials.

Examples of pairs of poorly compatible materials that can be used for shell 50 and optical body 8 are given in European Patent Application n. EP-A-0984249, the content of which is included herein by way of reference. For example, optical body 8 may be made of polycarbonate or polymethyl methacrylate, and shell 50 of a polyolefin or polyamide polymer.

The whole of supporting structure 9 (including shell 50 and supporting members 25) may advantageously be made in one piece from the same material.

Besides centring and, more generally, ensuring correct positioning of optical body 8 with respect to LED 2, shell 50 also provides for effectively safeguarding optical body 8, and in particular lateral surface 51, against contaminants and possible damage, thus ensuring correct total-internal-reflection operation of optical body 8.

The advantages, as compared with the known state of the art, of module 1 according to the invention will be clear from the foregoing description.

In particular, module 1 can be produced and assembled easily, quickly, and relatively cheaply, for example, as follows: plate 3 (of the desired shape and size and complete with seats 7), the subassembly defined by LED 2 and mount 5 (possibly comprising dissipating plate 6), and lens 4 (e.g. molded integrally with supporting members 25) are produced separately; plate 3 is then fitted successively with mount 5 (e.g. bonded to plate 3 using conductive adhesive), and with lens 4, by inserting the longitudinal ends 29 of supporting members 25 through respective seats 7 and fitting collar 15 about LED 2; and, once lens 4 is aligned correctly with LED 2, longitudinal ends 29 are locked, e.g. hot-riveted, inside respective seats 7. Fitting lens 4 directly to plate 3 eliminates the need for additional mechanical components and (unlike conventional systems) for relatively complex, time-consuming bonding operations, and can also be performed automatically or semi-automatically.

Moreover, in actual use, cooling windows 27 and optional ventilation openings 18 provide for effectively dissipating the heat generated by LED 2, which is also assisted by plate 3 and by fitting mount 5 to plate 3 using conducting adhesive.

Clearly, changes may be made to the module as described and illustrated herein without, however, departing from the scope of the present invention.

The invention claimed is:

1. A lens, comprising:
    an optical body disposed about an optical axis and having an input surface for receiving light from a light source and an output surface for the light, the optical body being configured to transmit light from the input surface to the output surface at least partially via total internal reflection, the optical body being rotationally symmetric about the optical axis;
    a plurality of rod-shaped supporting members extending from the optical body and spaced circumferentially thereabout from one another, each of said members being adapted for fitting at an end thereof to a supporting plate, the supporting members being separated from one another by plurality of cooling windows;
    wherein the supporting members are formed in one piece with the optical body.

2. The lens of claim 1, wherein the optical body is tapered along the optical axis.

3. The lens of claim 1, wherein the optical body comprises a recess for receiving the light source.

4. The lens of claim 3, wherein the recess is defined by a collar for radially surrounding the light source, the collar comprising one or more ventilation openings.

5. The lens of claim 1, wherein the supporting members extend from the optical body in a direction substantially parallel to the optical axis.

6. The lens of claim 1, wherein the light source comprises a solid-state light source that is mounted on the supporting plate.

7. A lens, comprising:
    an optical body having an input surface for receiving light from a light source and an output surface for the light, the optical body being configured to transmit light from the input surface to the output surface at least partially via total internal reflection;
    a shell covering a lateral surface of the optical body, the shell being separated from the lateral surface by a gap such that at least some light from the light source incident upon the lateral surface is totally internally reflected within the optical body;
    a plurality of rod-shaped supporting members extending from the shell and spaced circumferentially thereabout from one another, the supporting members being spaced apart and separated from one another by cooling windows.

8. The lens of claim 7, wherein the optical body is rotationally symmetric about an optical axis thereof.

9. The lens of claim 7, wherein the optical body and shell are made of different materials.

10. The lens of claim 7, wherein the optical body comprises a recess for receiving the light source.

11. The lens of claim 10, wherein the recess is defined by a collar for radially surrounding the light source, the collar comprising one or more ventilation openings.

12. The lens of claim 7, further comprising retaining members projecting from the shell for securing the optical body and the shell to each other.

13. The lens of claim 7, wherein the shell comprises a wall surrounding the lateral surface of the optical body and defining an inner cavity for receiving the optical body, the wall being tapered along an optical axis of the optical body.

14. The lens of claim 7, wherein the supporting members extend from the optical body in a direction substantially parallel to an optical axis of the optical body.

15. The lens of claim 7, wherein the light source comprises a solid-state light source that is mounted on a supporting plate.

16. A lens, comprising:
- a substantially cup-shaped optical body having an input surface for receiving light from a light source and an output surface for the light, the optical body being configured to transmit light from the input surface to the output surface at least partially via total internal reflection;
- a plurality of rod-shaped supporting members extending from a peripheral edge of the optical body in a direction substantially parallel to the optical axis of the optical body and spaced circumferentially thereabout from one another, each of said members being adapted for fitting at an end thereof to a supporting plate, the supporting members being separated from one another by cooling windows.

17. The lens of claim 16, wherein the supporting members are formed in one piece with the optical body.

18. The lens of claim 16, wherein the light source comprises a solid-state light source that is mounted on the supporting plate.

19. The lens of claim 16, wherein the optical body comprises a recess for receiving the light source.

20. The lens of claim 19, wherein the recess is defined by a collar for radially surrounding the light source, the collar comprising one or more ventilation openings.

* * * * *

UNITED STATES PATENT AND TRADEMARK OFFICE
CERTIFICATE OF CORRECTION

PATENT NO.       : 7,474,474 B2  
APPLICATION NO.  : 12/028525  
DATED            : January 6, 2009  
INVENTOR(S)      : Marco Angelini et al.

Page 1 of 1

It is certified that error appears in the above-identified patent and that said Letters Patent is hereby corrected as shown below:

At column 1, line 9, change "Dec. 9, 2001" to Dec. 6, 2001.

Signed and Sealed this

Thirtieth Day of June, 2009

JOHN DOLL  
*Acting Director of the United States Patent and Trademark Office*